(12) United States Patent
Lin

(10) Patent No.: US 7,375,566 B2
(45) Date of Patent: May 20, 2008

(54) CLOCK SIGNAL GENERATOR

(75) Inventor: Xu-Shan Lin, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 142 days.

(21) Appl. No.: 11/273,815

(22) Filed: Nov. 14, 2005

(65) Prior Publication Data

US 2006/0103481 A1 May 18, 2006

(30) Foreign Application Priority Data

Nov. 12, 2004 (CN) .................... 2004 1 0052262

(51) Int. Cl.
*H03K 5/01* (2006.01)

(52) U.S. Cl. ..................... 327/166; 327/291

(58) Field of Classification Search ........... 327/165, 327/166

See application file for complete search history.

(56) References Cited

U.S. PATENT DOCUMENTS

| 4,376,262 | A | * | 3/1983 | Okuda et al. ............ 318/696 |
|---|---|---|---|---|
| 4,417,158 | A | | 11/1983 | Ito et al. |
| 4,644,536 | A | * | 2/1987 | Utsumi ..................... 370/509 |
| 4,816,700 | A | | 3/1989 | Imel |
| 5,157,665 | A | * | 10/1992 | Fakhraie-Fard et al. .... 714/712 |
| 5,159,255 | A | | 10/1992 | Weber ....................... 318/775 |
| 6,215,224 | B1 | * | 4/2001 | Kataoka et al. ......... 310/316.02 |
| 6,701,445 | B1 | * | 3/2004 | Majos ........................ 713/500 |
| 6,888,391 | B2 | * | 5/2005 | Saita ........................ 327/291 |
| 2003/0098733 | A1 | * | 5/2003 | Saita ........................ 327/291 |
| 2004/0017232 | A1 | * | 1/2004 | Adams ..................... 327/114 |
| 2005/0218953 | A1 | * | 10/2005 | Slawecki ................... 327/276 |

* cited by examiner

Primary Examiner—Kenneth B. Wells
Assistant Examiner—Ryan C. Jager
(74) Attorney, Agent, or Firm—Morris Manning Martin LLP; Tim Tingkang Xia, Esq.

(57) ABSTRACT

A clock signal generator includes a quartz crystal multivibrator circuit and a pulse-shaping circuit. The pulse-shaping circuit includes a D trigger. The D trigger includes a Q terminal, a Q' terminal, a CP terminal, and a D terminal. An output signal from the quartz crystal multivibrator is transferred to the CP terminal. The Q' terminal is connected to the D terminal. The Q terminal is an output end of the clock signal. A capacitor C4 is connected between the CP terminal and ground. A capacitor C5 is connected between the D terminal and ground. The capacitance of the capacitors C4 and C5 is adjusted to attain a clock signal of a predetermined frequency.

15 Claims, 3 Drawing Sheets

CLOCK SIGNAL GENERATOR

BACKGROUND OF THE INVENTION

1. Field of the Invention

The present invention relates to clock signal generators, and particularly to a generator for generating an adjustable and stable rectangular waveform.

2. General Background

The role of a clock signal in a network is to distribute a common frequency throughout the network to provide synchronization in the network. A range within which the frequency is distributed depends on the basic configuration of the network. A network of a network synchronization type is constructed in the case of a long distance communications system. In the network of the network synchronization type, a single master station or quasi-master station distributes a clock signal at the reference frequency (hereinafter, referred to as the reference clock signal), and the reference clock signal is played back in every node within the network. In this system, all the circuits within the network use the same frequency, which enables transmission/reception processing, such as multiplexing/separation of data, and insertion/extraction of information with the use of a memory, to be performed quite easily.

Referring to FIG. 5, a conventional clock signal generator includes a first inverting amplifier 51, a second inverting amplifier 52, a quartz crystal 53, a resistor R5, a resistor R6, and a capacitor C1. The resistor R6 is connected between an output end and an input end of the first inverting amplifier 51. The resistor R5 is connected between an output end and an input end of the second inverting amplifier 52. The quartz crystal 53 is connected between the input end of the first inverting amplifier 51 and the output end of the second inverting amplifier 52. The capacitor C1 is connected in series between the first inverting amplifier 51 and the second inverting amplifier 52. The output of the conventional clock signal generator is a sine wave. A computer system generally requires a rectangular wave. Therefore a conventional clock signal does not fulfill the requirements of a computer system.

What is needed is to provide a clock signal generator which can overcome the above shortcoming.

SUMMARY

A clock signal generator includes a quartz crystal multivibrator circuit and a pulse-shaping circuit. The pulse-shaping circuit includes a D trigger. The D trigger includes a Q terminal, a Q' terminal, a CP terminal, and a D terminal. An output signal from the quartz crystal multivibrator circuit is transferred to the CP terminal. The Q' terminal is connected to the D terminal. The Q terminal is an output end of the clock signal. A capacitor C4 is connected between the CP terminal and ground. A capacitor C5 is connected between the D terminal and ground. The capacitance of the capacitors C4 and C5 is adjusted to attain a clock signal of a predetermined frequency.

Other advantages and novel features will be apparent from the following detailed description when taken in conjunction with the accompanying drawings, in which:

DETAILED DESCRIPTION OF THE EMBODIMENT

Figure 1:
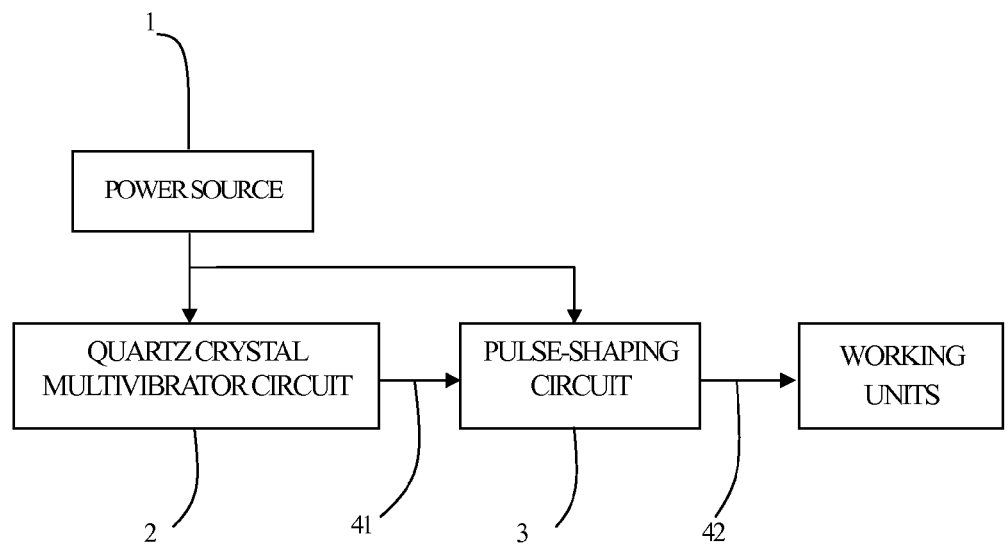
FIG. 1 is a block diagram of an application environment of a clock signal generator in accordance with a preferred embodiment of the present invention, the clock signal generator including a quartz crystal multivibrator, and a pulse-shaping circuit.

Referring to FIG. 1, a clock signal generator in accordance with a preferred embodiment of the present invention is for generating a stable rectangular wave. The clock signal generator includes a power source 1, a quartz crystal multivibrator circuit 2, and a pulse-shaping circuit 3. The power source 1 is a direct current supply, for providing working power to the quartz crystal multivibrator circuit 2 and the pulse-shaping circuit 3. The pulse-shaping circuit 3 shapes an output signal 41 (first clock signals) from the quartz crystal multivibrator circuit 2 to provide work units second clock signals 42.

Figure 2:
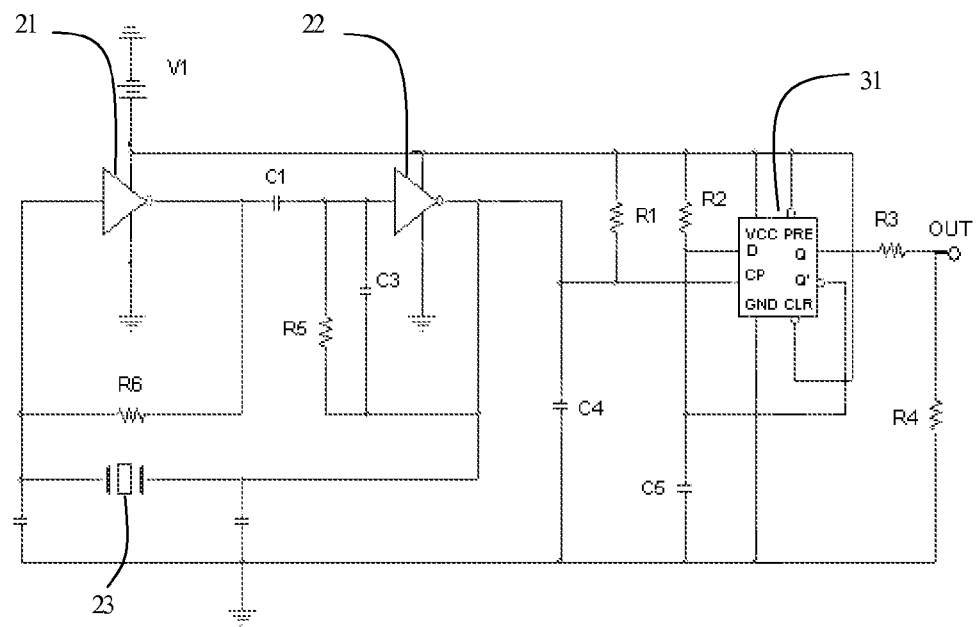
FIG. 2 is a circuit diagram of the clock signal generator of FIG. 1, including two capacitors.

Referring also to FIG. 2, the quartz crystal multivibrator circuit 2 includes a first inverting amplifier 21, a second inverting amplifier 22, a quartz crystal 23, a resistor R5, a resistor R6, a coupling capacitor C1, and a capacitor C3. The resistor R5 is connected between an output end and an input end of the first inverting amplifier 21 to ensure the first inverting amplifier 21 is working in a linearly amplifying region. The resistor R6 is connected between an output end and an input end of the second inverting amplifier 22 to ensure the second inverting amplifier 22 is working in a linearly amplifying region. The coupling capacitor C1 is in series connected between the first inverting amplifier 21 and the second inverting amplifier 22. The capacitor C3 is connected between two ends of the resistor R5 in parallel, for suppressing ultraharmonics. The quartz crystal 23 is connected between the input end of the first inverting amplifier 21 and the output end of the second inverting amplifier 22. The quartz crystal multivibrator circuit 2 is a regenerative feedback loop and self oscillates without any triggering signal. The quartz crystal 23, having its own frequency and reactance characteristics, allows the easy passage of a particular frequency signal while weakening the signal of other frequencies.

The pulse-shaping circuit 3 includes a D trigger 31, a capacitor C4, a capacitor C5, a resistor R1, a resistor R2, a dropping resistor R3, and a dropping resistor R4. The D trigger 31 includes a VCC terminal, a PRE terminal (serving as a setting terminal), a CLR terminal (serving as a resetting terminal), a GND terminal connected to ground, a CP terminal (serving as a synchronizing signal input terminal), a Q terminal (serving as a first signal input end), a Q' terminal (serving as a second signal input terminal inverted to the first signal input terminal), and a D terminal (serving as a trigger terminal). The VCC terminal, the PRE terminal, and the CLR terminal are all connected to the power source 1. The output end of the second inverting amplifier 22 is connected to the CP terminal. The Q' terminal is connected to the D terminal. An output state of the Q terminal is opposite to an output state of the Q' terminal. The capacitor C4 is connected between the CP terminal and ground. The capacitor C5 is connected between the D terminal and ground. The capacitance of the capacitors C4 and C5 can be changed to adjust the frequency of the clock signal. The resistor R1 is connected between the power source 1 and the CP terminal, and the resistor R2 is connected the power source 1 and the D terminal, for increasing an input voltage to the D trigger 31 and thus preventing too low an input voltage for activating the D trigger 31. The dropping resistors R3 and R4 are connected in series between the Q terminal and ground. The D trigger 31 can be replaced by a JK trigger.

Figure 3:
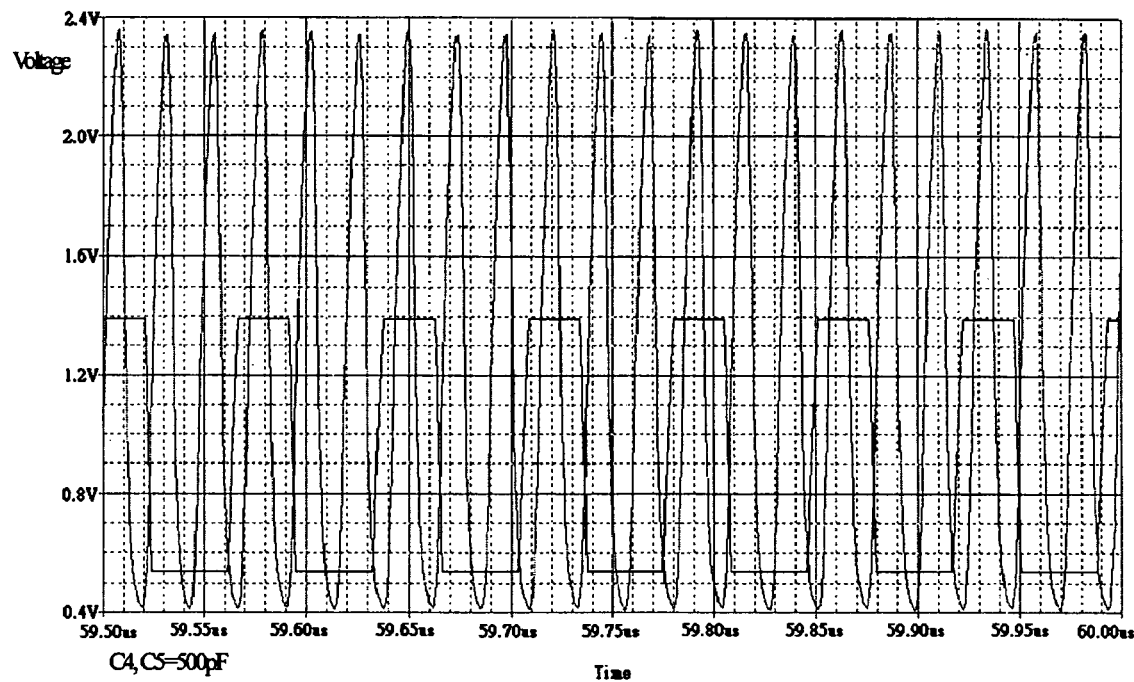
FIG. 3 is a graph of a waveform output from the quartz crystal multivibrator contrast with that of the pulse-shaping circuit of FIG. 1, when a capacitance of each of the capacitors is 500 pF.
Figure 4:
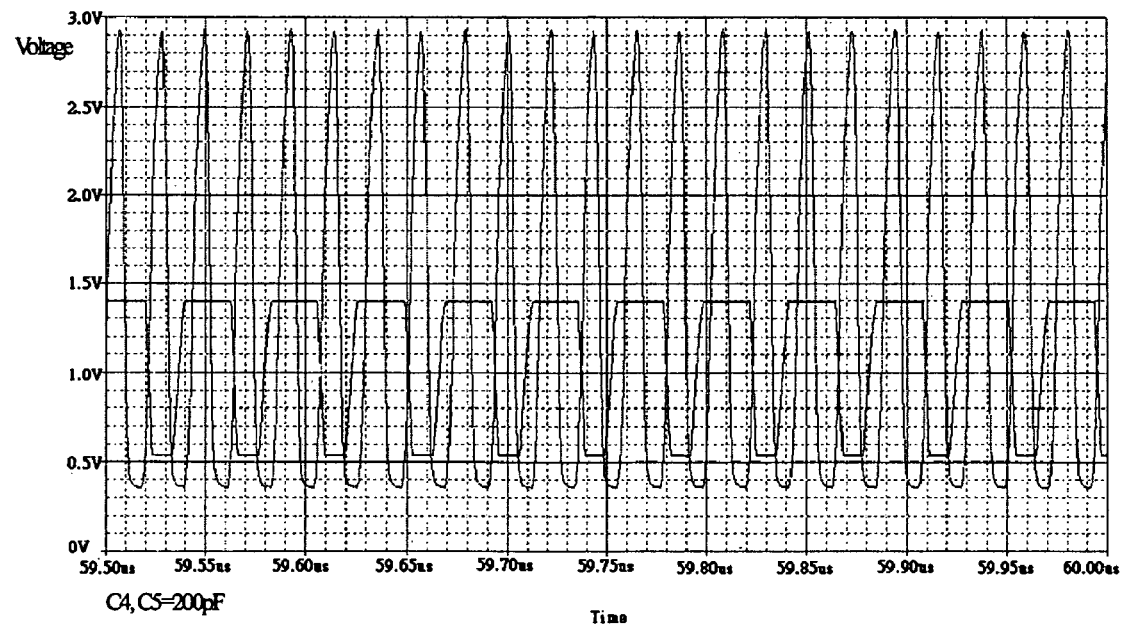
FIG. 4 is a graph similar to that of FIG. 3, but when a capacitance of each of the capacitors is 200 pF.
Figure 5:
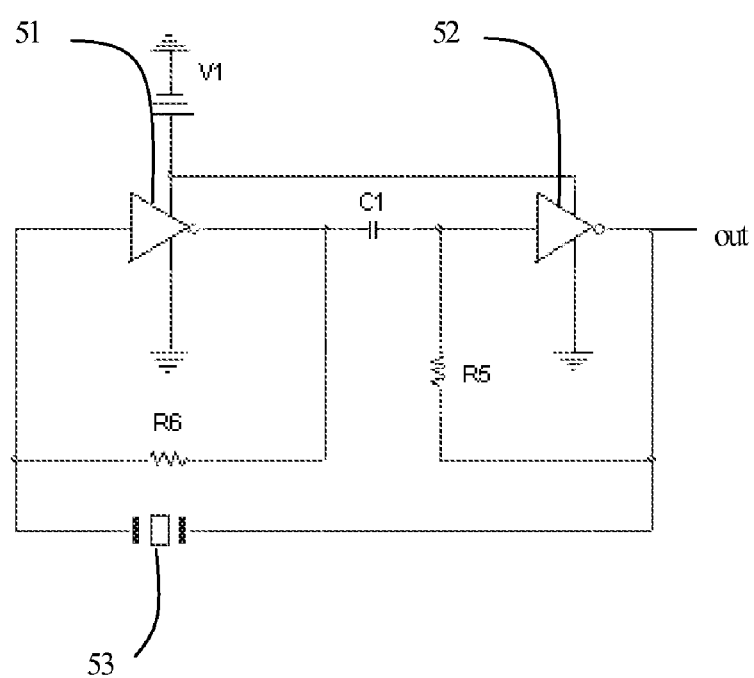
FIG. 5 is a schematic circuit diagram of a conventional quartz crystal multivibrator.

The quartz crystal multivibrator circuit 2 self oscillates and generates an original clock signal. The clock signal is transported from the output end of the second inverting amplifier 22 to the CP terminal of the D trigger and is shaped as a rectangular wave. The resistors R3 and R4 can be changed to adjust the output voltage of the rectangular wave. The output waveform of the quartz crystal multivibrator circuit 2 is resembles a sine wave, and is shaped by the pulse-shaping circuit 3 to a rectangular wave. Referring also to FIGS. 3 and 4, when the capacitance of the capacitors C4 and C5 is changed from 500 pF to 200 pF, the frequency of the clock signal changes accordingly.

It is believed that the present invention and its advantages can be understood from the foregoing description, and that it is apparent that various changes may be made thereto without departing from the spirit and scope of the invention or sacrificing all of its material advantages, the examples described merely being preferred or exemplary embodiments of the invention.

What is claimed is:

1. A clock signal generator for producing a stable clock signal, comprising:
   a power supply;
   a quartz crystal multivibrator circuit providing a sine wave signal; and
   a pulse-shaping circuit comprising a trigger to shape the sine wave signal to a rectangular wave, the trigger comprising a synchronising signal input terminal connected to the quartz crystal multivibrator, a first terminal for the rectangular clock signal output, a second terminal inverting to the first terminal, and a trigger terminal connected to the second terminal and connected to the power supply, wherein
   the trigger is a D trigger, the D trigger comprises a VCC terminal, a GND terminal connected to ground, a CP terminal serving as the synchronising signal input terminal, a Q terminal serving as the first output end, a Q' terminal serving as the second output end, and a D terminal serving as the trigger terminal, and wherein
   the pulse-shaping circuit further comprises a first capacitor and a second capacitor, wherein the first capacitor is connected between the CP terminal and ground, the second capacitor is connected between the D terminal and ground, and capacitances of the first and second capacitors can be changed to adjust a frequency of the clock signal, the D terminal connected to the power supply via a resistor.

2. The clock signal generator as claimed in claim 1, wherein a first resistor and a second resistor are connected between the Q terminal and ground, and resistances of the first and second resistors can be changed to adjust an output voltage of the clock signal.

3. The clock signal generator as claimed in claim 1, wherein the D trigger further comprises a PRE terminal and a CLR terminal both connected to the power supply.

4. The clock signal generator as claimed in claim 1, wherein a first resistor is connected between the CP terminal and the power supply, and a second resistor is connected between the D terminal and the power supply, for increasing an input voltage to the D trigger.

5. The clock signal generator as claimed in claim 1, wherein the quartz crystal multivibrator circuit comprises a first inverting amplifier, a second inverting amplifier, a coupling capacitor, a first feedback resistor connected between an input end and an output end of the first inverting amplifier, and a second feedback resistor connected between an input end and an output end of the second inverting amplifier, and the first and second inverting amplifiers are connected to the power supply, and the coupling capacitor is connected between the first inverting amplifier and the second inverting amplifier.

6. The clock signal generator as claimed in claim 5, wherein a quartz crystal is connected between the input end of the first inverting amplifier and the output end of the second inverting amplifier.

7. The clock signal generator as claimed in claim 5, wherein the quartz crystal multivibrator circuit comprises a capacitor connected between the input end and output end of the second inverting amplifier is for suppressing ultraharmonics.

8. A clock signal generator for producing a stable clock signal, comprising:
   a power supply;
   a quartz crystal multivibrator circuit for producing an original sine wave clock signal; and
   a pulse-shaping circuit for shaping the original clock signal to a rectangular wave, the pulse-shaping circuit comprising a trigger, the trigger comprising a synchronizing signal input terminal receiving the original clock signal, a first rectangular wave output end, a second rectangular wave output end inverted to the first rectangular wave output end, a trigger terminal connected to the second rectangular wave output end and connected to the power supply, wherein
   the trigger is a D trigger, the D trigger comprises a VCC terminal, a GND terminal connected to ground, a CP terminal sewing as the synchronizing signal input terminal, a Q terminal sewing as the first rectangular wave output end, a Q' terminal serving as the second rectangular wave output end, and a D terminal serving as the trigger terminal; and wherein
   a first resistor is connected between the CP terminal and the power supply, and a second resistor is connected between the D terminal and the power supply, for increasing an input voltage of the D trigger.

9. The clock signal generator as claimed in claim 8, wherein the pulse-shaping circuit further comprises a first capacitor and a second capacitor, the first capacitor is connected between the CP terminal and ground, the second capacitor is connected between the D terminal and ground, and capacitances of the first and second capacitors can be changed to adjust the frequency of the clock signal, the D terminal connected to the power supply via a resistor.

10. The clock signal generator as claimed in claim 8, wherein the quartz crystal multivibrator circuit comprises a first inverting amplifier, and a second inverting amplifier, a coupling capacitor, a first feedback resistor connected between an input end and an output end of the first inverting amplifier, and a second feedback resistor connected between an input end and an output end of the second inverting amplifier, and the first and second inverting amplifiers are connected to the power supply, and the coupling capacitor is connected between the first and second inverting amplifiers.

11. The clock signal generator as claimed in claim 10, wherein a quartz crystal multivibrator is connected between the input end of the first inverting amplifier and the output end of the second inverting amplifier.

12. The clock signal generator as claimed in claim 11, wherein the quartz crystal multivibrator circuit comprises a capacitor connected between the input end and output end of the second inverting amplifier, for suppressing ultraharmonics.

13. The clock signal generator as claimed in claim 8, wherein a first resistor and a second resistor are connected between the Q terminal and ground, and resistances of the first and second resistors can be changed to adjust an output voltage of the rectangular wave.

14. The clock signal generator as claimed in claim 8, wherein the D trigger further comprises a PRE terminal, and a CLR terminal both connected to a power supply.

15. A clock signal generator for producing a stable clock signal, comprising:

a power supply;

a quartz crystal multivibrator circuit providing a sine wave signal; and a pulse-shaping circuit comprising a trigger to shape the sine wave signal to a rectangular wave, the trigger comprising a synchronizing signal input terminal connected to the quartz crystal multivibrator, a first terminal for the rectangular clock signal output, a second terminal inverting to the first terminal, and a trigger terminal connected to the second terminal and connected to the power supply, wherein the trigger is a D trigger, the D trigger comprises a VCC terminal, a GND terminal connected to ground, a CP terminal serving as the synchronizing signal input terminal, a Q terminal serving as the first output end, a Q' terminal serving as the second output end, and a D terminal serving as the trigger terminal, and wherein a first resistor and a second resistor are connected between the Q terminal and ground, and resistances of the first and second resistors can be changed to adjust an output voltage of the clock signal.

* * * * *